United States Patent
Tunali et al.

(10) Patent No.: US 9,667,276 B1
(45) Date of Patent: May 30, 2017

(54) EFFICIENT LOW ERROR-FLOOR LDPC CODES

(71) Applicant: Xilinx, Inc., San Jose, CA (US)

(72) Inventors: Nihat E. Tunali, Campbell, CA (US); Raied N. Mazahreh, Sandy, UT (US); Hai-Jo Tarn, Saratoga, CA (US)

(73) Assignee: XILINX, INC., San Jose, CA (US)

(*) Notice: Subject to any disclaimer, the term of this patent is extended or adjusted under 35 U.S.C. 154(b) by 15 days.

(21) Appl. No.: 14/820,430

(22) Filed: Aug. 6, 2015

(51) Int. Cl.
*H03M 13/00* (2006.01)
*H03M 13/11* (2006.01)

(52) U.S. Cl.
CPC ..... *H03M 13/616* (2013.01); *H03M 13/1102* (2013.01)

(58) Field of Classification Search
CPC ................ H03M 13/616; H03M 13/1102
See application file for complete search history.

(56) References Cited

U.S. PATENT DOCUMENTS

| 2008/0178065 A1* | 7/2008 | Khandekar | H03M 13/6516 714/801 |
| 2009/0164864 A1* | 6/2009 | Matsumoto | H03M 13/116 714/752 |

* cited by examiner

*Primary Examiner* — Sam Rizk
(74) *Attorney, Agent, or Firm* — Gerald Chan; David O'Brien

(57) ABSTRACT

A system for providing data encoding includes: an encoder configured to encode message data with an encoding parity-check matrix having a parity part that is in lower-triangular form to generate an encoded message data, the encoded message data being for decoded by a decoder; wherein the encoding parity-check matrix is based on a decoding parity-check matrix that does not comprise any degree-1 node in a parity part of the decoding parity-check matrix; and wherein the system further comprises a non-transitory medium for storing the encoding parity-check matrix, wherein the non-transitory medium is a part of the encoder or is communicatively coupled to the encoder.

20 Claims, 15 Drawing Sheets

150

$$H = \begin{pmatrix} 1 & 0 & 1 & 0 & 1 & 0 & 1 & 0 & 1 & 0 & 1 & 0 & 1 & 0 & 1 & 0 & 1 & 0 & 1 & 0 & 0 & 0 & 0 & 0 & 0 & 0 & 0 & 0 \\ 0 & 0 & 0 & 0 & 0 & 1 & 1 & 0 & 0 & 0 & 0 & 1 & 1 & 0 & 0 & 0 & 0 & 1 & 1 & 0 & 0 & 1 & 0 & 0 & 0 & 0 & 0 & 0 \\ 0 & 1 & 0 & 1 & 0 & 0 & 0 & 1 & 0 & 1 & 0 & 0 & 0 & 1 & 0 & 1 & 0 & 0 & 0 & 1 & 0 & 1 & 1 & 0 & 0 & 0 & 0 & 0 \\ 1 & 0 & 1 & 0 & 1 & 0 & 0 & 0 & 1 & 0 & 1 & 0 & 0 & 0 & 1 & 0 & 1 & 0 & 0 & 0 & 1 & 0 & 0 & 1 & 0 & 0 & 0 & 0 \\ 0 & 0 & 0 & 0 & 0 & 0 & 0 & 0 & 0 & 0 & 0 & 0 & 0 & 1 & 0 & 0 & 0 & 0 & 0 & 0 & 0 & 0 & 0 & 0 & 1 & 0 & 0 & 0 \\ 0 & 1 & 0 & 1 & 0 & 1 & 0 & 1 & 0 & 1 & 0 & 1 & 1 & 0 & 1 & 1 & 0 & 1 & 0 & 1 & 0 & 1 & 1 & 1 & 0 & 0 & 0 & 0 \\ 0 & 0 & 0 & 0 & 1 & 0 & 1 & 0 & 0 & 0 & 1 & 0 & 1 & 0 & 0 & 0 & 1 & 0 & 0 & 1 & 1 & 0 & 0 & 1 & 0 & 0 & 0 & 0 \\ 0 & 0 & 0 & 0 & 0 & 1 & 0 & 0 & 0 & 0 & 0 & 1 & 0 & 0 & 0 & 0 & 0 & 1 & 0 & 0 & 1 & 0 & 0 & 0 & 0 & 1 & 0 & 0 \\ 1 & 0 & 1 & 0 & 0 & 0 & 0 & 0 & 1 & 0 & 0 & 0 & 0 & 0 & 0 & 0 & 0 & 0 & 0 & 0 & 0 & 1 & 0 & 1 & 0 & 1 & 1 & 0 \\ 0 & 1 & 0 & 1 & 0 & 0 & 0 & 1 & 0 & 1 & 0 & 0 & 0 & 1 & 0 & 1 & 0 & 0 & 0 & 1 & 0 & 0 & 0 & 0 & 1 & 1 & 1 & 1 \end{pmatrix} \begin{matrix} h_1 \\ h_2 \\ h_3 \\ h_4 \\ h_5 \\ h_6 \\ h_7 \\ h_8 \\ h_9 \\ h_{10} \end{matrix}$$

Information 152     Parity 154

Fig. 1-2

Identify first row with a cell having a value of "1" that is above a diagonal row of the matrix
520

Identify second row with a cell having a value of "1", wherein the cell having the value of "1" in the second row is in the same column as the cell with the value of "1" in the first row.
522

Perform matrix row operation to subtract the first row from the second row, or vice versa, to thereby obtain a new row
524

Replace the first row with the new row to thereby eliminate the cell having the value of "1" in the first row
526

$\tilde{h}_8^{III} = $

$\hat{h}_8''' =$

EFFICIENT LOW ERROR-FLOOR LDPC CODES

TECHNICAL FIELD

The following description relates to encoding and decoding data using low-density parity-check (LDPC) codes.

BACKGROUND

Low-density parity-check (LDPC) codes are a class of error-correcting codes that can be efficiently encoded and decoded in hardware. As their name suggests, LDPC codes are linear codes that have sparse parity-check matrices. The sparseness of the parity-check matrices allow for computationally inexpensive error correction. More recently, the introduction of quasi-cyclic LDPC (QC-LDPC) codes has made it possible for LDPC codes to be decoded in parallel, resulting in increased throughput.

New systems and methods for low error-floor LDPC codes are described herein.

SUMMARY

A method for providing data encoding includes: receiving message data at an encoder; encoding the message data with an encoding parity-check matrix having a parity part that is in lower-triangular form to generate an encoded messaged data; and transmitting the encoded message data to a decoder for decoding the encoded message data; wherein the encoding parity-check matrix is based on a decoding parity-check matrix that does not comprise any degree-1 node in a parity part of the decoding parity-check matrix.

Optionally, the encoding parity-check matrix is derived from the decoding parity-check matrix using one or more matrix operations.

Optionally, the encoding parity-check matrix is derived from the decoding parity-check matrix by performing one or more matrix row operations to change a matrix cell with a value of "1" to a value of "0", the matrix cell being above a diagonal of cells in the parity part of the decoding parity-check matrix.

Optionally, the method further includes determining the encoding parity-check matrix by: identifying a first row in the decoding parity-check matrix having a matrix cell with a value of "1" that is above a diagonal row in the parity part of the decoding parity-check matrix; identifying a second row in the decoding parity-check matrix having a matrix cell with a value of '1", wherein the matrix cell with the value of "1" in the second row is in a same column as the matrix cell with the value of "1" in the first row; performing one or more matrix row operations to subtract the second row from the first row, or vice versa, to obtain a new row; and replacing the first row with the new row.

Optionally, the encoding parity-check matrix comprises a quasi-cyclic low-density parity-check (LDPC) matrix, the quasi-cyclic LDPC matrix having an expansion sub-matrix.

Optionally, the method further includes generating a sub-matrix artifact by inverting the expansion sub-matrix.

Optionally, the method further includes using the sub-matrix artifact to determine one or more parity bits that correspond to the parity part of the encoding parity-check matrix.

A method for decoding the encoded message data includes using the decoding parity-check matrix to decode the encoded message data.

A system for providing data encoding includes: an encoder configured to encode message data with an encoding parity-check matrix having a parity part that is in lower-triangular form to generate an encoded message data, the encoded message data being for decoded by a decoder; wherein the encoding parity-check matrix is based on a decoding parity-check matrix that does not comprise any degree-1 node in a parity part of the decoding parity-check matrix; and wherein the system further comprises a non-transitory medium for storing the encoding parity-check matrix, wherein the non-transitory medium is a part of the encoder or is communicatively coupled to the encoder.

Optionally, the decoding parity-check matrix is for decoding the encoded message data.

Optionally, the parity part of the encoding parity-check matrix is different from the parity part of the decoding parity-check matrix.

Optionally, the system further includes a matrix generation unit configured to derive the encoding parity-check matrix from the decoding parity-check matrix using one or more matrix operations, the matrix generation unit being a part of the encoder or being in communication with the encoder.

Optionally, the one or more matrix operations include one or more matrix row operations.

Optionally, the matrix generation unit is configured to perform the one or more matrix row operations to change a matrix cell with a value of "1" to a value of "0", the matrix cell being above a diagonal of cells in the parity part of the decoding parity-check matrix.

Optionally, the matrix generation unit is configured to determine the encoding parity-check matrix by: identifying a first row in the decoding parity-check matrix having a matrix cell with a value of "1" that is above a diagonal row in the parity part of the decoding parity-check matrix; identifying a second row in the decoding parity-check matrix having a matrix cell with a value of '1", wherein the matrix cell with the value of "1" in the second row is in a same column as the matrix cell with the value of "1" in the first row; performing one or more matrix row operations to subtract the second row from the first row, or vice versa, to obtain a new row; and replacing the first row with the new row.

Optionally, the encoding parity-check matrix comprises a quasi-cyclic low-density parity-check (LDPC) matrix, the quasi-cyclic LDPC matrix having an expansion sub-matrix.

Optionally, the system further includes a sub-matrix artifact generation unit configured to generate a sub-matrix artifact by inverting the expansion sub-matrix.

Optionally, the encoder is configured to use the sub-matrix artifact to determine one or more parity bits that correspond to the parity part of the encoding parity-check matrix.

Optionally, the system further includes the decoder.

A system for providing data decoding includes: a decoder configured to receive an encoded message data, and to decode the encoded message data based on a decoding parity-check matrix, wherein the decoding parity-check matrix does not comprise any degree-1 node in a parity part of the decoding parity-check matrix; wherein the encoded message data is based on an encoding parity-check matrix having a parity part that is in lower-triangular form, the encoding parity-check matrix being based on the decoding parity-check matrix; wherein the system further comprises a non-transitory medium for storing the decoding parity-check matrix, wherein the non-transitory medium is a part of the decoder or is communicatively coupled to the decoder; and wherein the parity part of the decoding parity-check matrix is different from the parity part of the encoding parity-check matrix.

Other additional objects, features, and advantages of the invention are described in the detailed description, figures, and claims.

BRIEF DESCRIPTION OF THE DRAWINGS

Accompanying drawings show exemplary apparatus (es) and/or method(s). However, the accompanying drawings should not be taken to limit the scope of the claims, but are for explanation and understanding only.

FIG. 1-2 illustrates a parity-check matrix in lower-triangular form.

FIG. 2-1 illustrates a bit error rate (BER) chart with no error-floor.

FIG. 2-2 illustrates a bit error rate (BER) chart with an error-floor.

FIG. 5-1 shows a method for generating an encoding parity-check matrix.

FIG. 5-2 shows a part of the method of FIG. 5-1.

FIG. 6-1 illustrates a decoding parity-check matrix without degree-1 nodes.

FIG. 6-2 illustrates an intermediate parity-check matrix.

FIG. 6-3 illustrates an encoding parity-check matrix in lower-triangular form.

FIGS. 7-1 to 7-2 illustrate expanded LDPC sub-matrices.

FIGS. 8-1 to 8-3 illustrate expanded LDPC sub-matrices.

DETAILED DESCRIPTION

Figure 1:
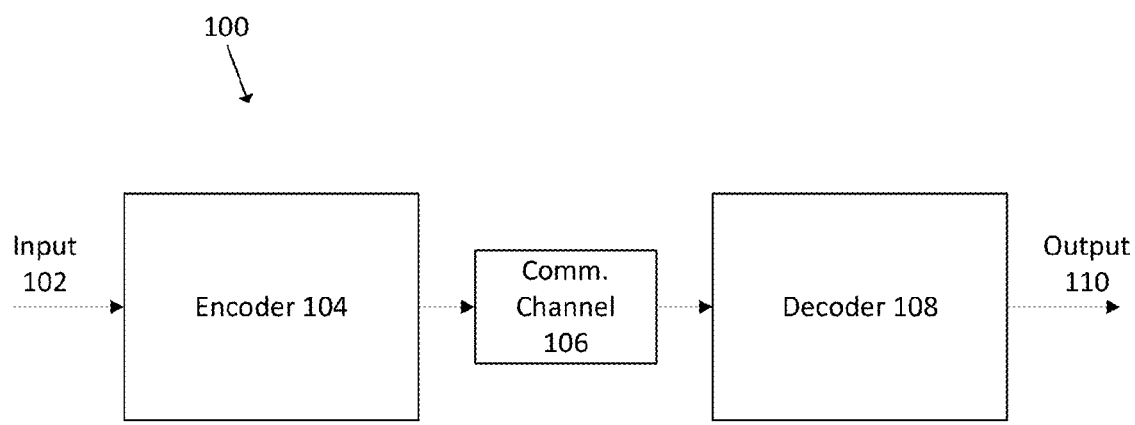
FIG. 1-1 illustrates a block diagram of encoding and/or decoding system.

Various embodiments are described hereinafter with reference to the figures. It should be noted that the figures are not drawn to scale and that elements of similar structures or functions are represented by like reference numerals throughout the figures. It should also be noted that the figures are only intended to facilitate the description of the embodiments. They are not intended as an exhaustive description of the invention or as a limitation on the scope of the invention. In addition, an illustrated embodiment needs not have all the aspects or advantages shown. An aspect or an advantage described in conjunction with a particular embodiment is not necessarily limited to that embodiment and can be practiced in any other embodiments even if not so illustrated, or if not so explicitly described.

For encoding LDPC codes, increased performance may be attained by choosing a parity part of a parity-check matrix in lower-triangular form. A matrix in lower-triangular form is any matrix having all zero matrix values in an upper triangular area of the matrix. However, the lower-triangular form has degree-1 variable nodes (e.g., a column in the parity part of the parity-check matrix with only 1 bit). Degree-1 variable nodes result in poor error-floor performance because decoding algorithms often depend on multiple bit-values in the columns of the parity part of a parity-check matrix to detect errors and to determine appropriate corrections. In one approach, the parity part of the parity-check matrix may be inverted to eliminate degree-1 variable nodes. However, inverting a sparse matrix may result in a dense matrix, which may be more computationally expensive to process.

In some cases, WIMAX IEEE 802.16e LDPC codes may be used. However, implementations using the WIMAX codes require large hardware resources that may not be practical in some applications. Further, implementations using WIMAX codes still suffer high error-floors. As such, the WIMAX codes are not desirable for use in storage applications.

Accordingly, it may be desirable to have an increased efficiency LDPC codes that achieve low error-floor performance without sacrificing throughput performance or significantly increasing hardware requirements.

In one or more embodiments described herein, an approach for low error-floor LDPC codes is implemented using an encoding module configured to encode message data with an encoding parity-check matrix that is in lower-triangular form. The lower-triangular form allows for increased efficiency through recursive encoding processes. In some embodiments, the encoding parity-check matrix may be generated from a pre-generated or pre-selected decoding parity-check matrix that does not have degree-1 nodes using one or more matrix operations (e.g., matrix row addition). Also, in some embodiments, the encoding parity-check matrix and decoding parity-check matrices may be quasi-cyclic LDPC matrices comprising a plurality of sub-matrices, which allow for decoding parallelization. The parity-check matrix of a QC-LDPC code may include several circulant sub-matrices. In some hardware implementations, the circulant sub-matrices may be implemented as shifted identity matrices.

FIG. 1-1 illustrates an example of an encoding and/or decoding system 100 in which LDPC codes may be implemented. There, an input 102 may comprise message data that is input into an encoder 104. The encoder 104 may use a parity-check matrix to encode the message data so that error correction may be performed after transmission. After the message data is encoded, it may be sent over communication channel(s) 106 (e.g., one or more network channels) to the decoder 108. The decoder 108 receives the transmitted encoded message data, uses a parity-check matrix on the received message data to decode the encoded message data, and provides a decoded message data as an output 110. If errors in the encoded message data, such as bit-flips, occur during transmission over the communication channel(s) 106, the decoder 108 can detect and fix the error using LDPC error correction algorithm.

Figures 1, 2:
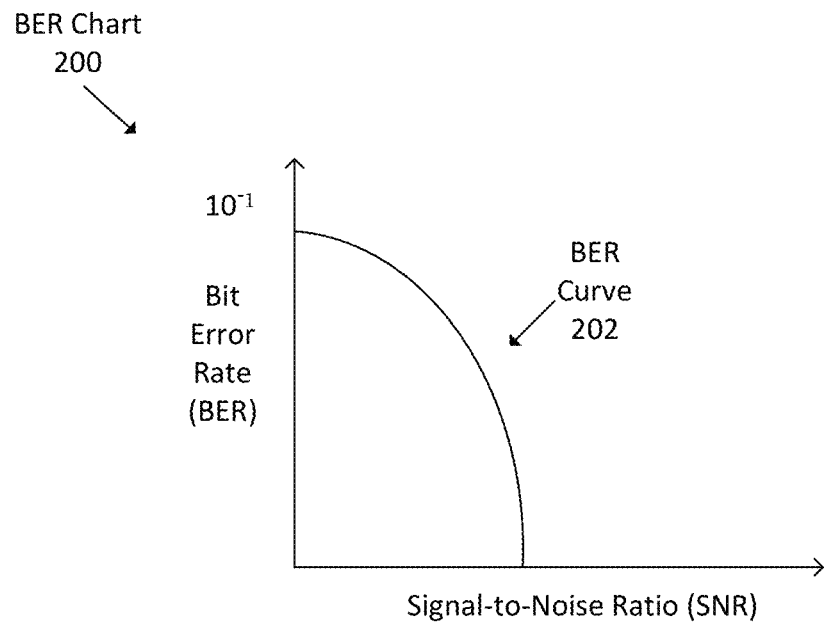
Figure 2:
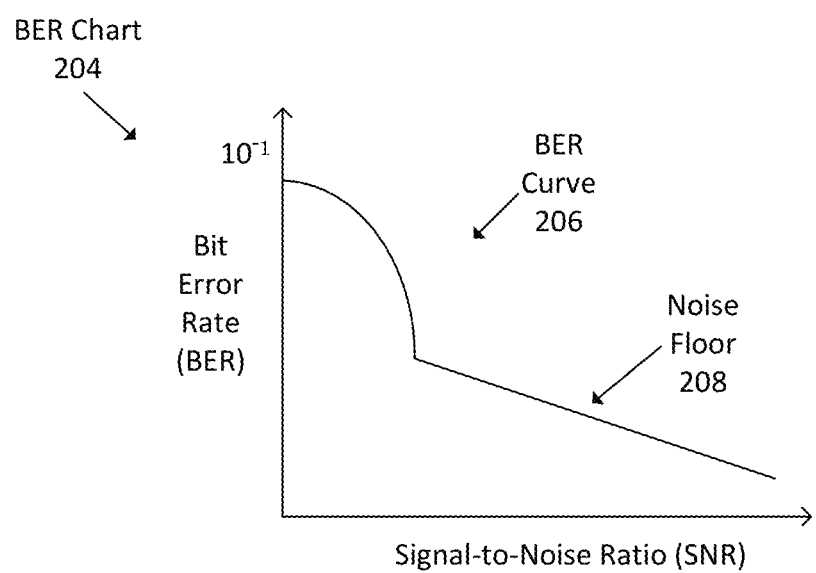

FIG. 1-2 illustrates an example of a parity-check matrix 150 comprising two parts, an information part 152 and a parity part 154. The information part 152 of the parity-check matrix includes information bits (e.g., information bits $i_1$, $i_2$, $i_3$ ... $i_{20}$). The parity part 154 of the parity-check matrix includes parity bits (e.g., parity bits $p_1$, $p_2$, $p_3$ ... $i_{10}$), which may be generated from the information part 152. Together, the information bits and the appended parity bits, form 30 coded bits, which may be denoted as C (e.g., $c=[i_1, i_2, i_3 \ldots i_{20}, p_1, p_2, p_3 \ldots i_{10}]$). In other embodiments, the number of coded bits may be different from 30 (e.g., more or less than 30).

The encoder 104 may receive message data as an input and operates on the message data with the information part 152 to generate the parity part 154. In some cases, to generate the parity part 154 with a high throughput and small footprint, the parity part 154 of the parity-check matrix may be structured in lower-triangular form (e.g., a matrix having a diagonal of 1's across the parity part 154 with zeroes above the diagonal). The lower-triangular form allows the encoder 104 to efficiently implement recursive operations when determining the parity bits. For example, given H (e.g., parity-check matrix 150) and information bits i, an encoder can determine the corresponding parity bits p such that $Hc^T=0$ (where T corresponds to the matrix transpose operation). Allowing $h_k$ to denote the $k^{th}$ row of H, then $h_1c^T=0$. Hence $i_1+i_3+i_5+i_7+i_9+i_{11}+i_{13}+i_{15}+i_{17}+i_{19}+p_1=0$ is a constraint which can be solved for $p_1$ (where the arithmetic operations are modulo 2, i.e., XOR operations). One technique to solve for p1 is to move p1 to the other side of the equation because XOR operation allows for such. Therefore, $i_1+i_3+i_5+i_7+i_9+i_{11}+i_{13}+i_{15}+i_{17}+i_{19}=p_1$. That is, the 1st, 3rd, 5th . . . 19th bits of the top row of the message data are added together modulo 2 (i.e., XOR together) to determine $p_1$, which may then be appended to the message bits. To see how this works, consider $i_1$ XOR $i_3$ XOR $i_7$ . . . XOR $i_{19}$ results in $p_1=1$. Then the original equation $i_1$ XOR $i_3$ XOR $i_7$ . . . XOR $i_{19}$ XOR $p_1=1$ XOR $1=0$, which is valid. As another example, consider $i_1$ XOR $i_3$ XOR $i_7$ . . . XOR $i_{19}$ results in $p_1=0$. Then the original equation $i_1$ XOR $i_3$ XOR $i_7$ . . . XOR $i_{19}$ XOR $p_1=0$ XOR $0=0$, which is also valid.

Similarly, $p_2$ may be determined using the constraint $h_2c^T=0$. Hence, $i_6+i_7+i_{12}+i_{13}+i_{18}+i_{19}=p_2$. The computation of $p_3$ is different since the constraint is $i_2+i_4+i_8+i_{10}+i_{14}+i_{16}+i_{20}+p_2+p_3=0$, resulting in two parity bits $p_2$, $p_3$ in the equation. However due to the lower-triangular form of the parity part, $p_2$ is known and $p_3$ can be determined by inserting $p_2$ into the $p_3$ constraint. Similarly, the remaining parity bits p can be determined in a similar manner recursively by taking advantage of the lower-triangular form of the parity part 154 of the parity-check matrix 150.

While lower-triangular form of the parity part 154 enables recursive operations in the encoding process, the same structure may cause errors in the decoding process in some cases. In particular, the last column of the parity-check matrix H has a value of "1" in the bottom right matrix cell. The parity-check matrix H corresponds to a bi-partite graph (e.g., a Tanner graph) that is used in the decoding process to check and correct bit errors. Values in the parity part correspond to variable nodes in the bi-partite graph. When a bit is flipped in transmission (e.g., an error during transmission), the decoding algorithm in the decoder can use the multiple column values in the parity part 154 as variable nodes to check if a bit is in error and can further use the variable nodes to correct the bit in error. However, when a column in the matrix has a single value in it (e.g., the last column in the example shown in FIG. 1-2), which may be referred to as a degree-1 variable node, a lack of information in the decoding algorithm may arise concerning whether a potential in-error bit is actually in error and how to correct the bit if it is in error.

FIGS. 2-1 and 2-2 illustrate how degree-1 variable nodes may cause a noise-floor or error-floor to occur. FIG. 2-1 shows a bit error rate (BER) chart 200 comprising a x-axis that corresponds to a signal-to-noise (SNR) ratio, y-axis that corresponds to a bit error rate (BER), and a bit error rate (BER) curve 202. In operation, the encoder 104 receives message data, encodes the message data, and transmits the encoded message data to the decoder 108. The decoder 108 then decodes the encoded message data. In some embodiments, the x-axis of the BER chart 200 corresponds to a signal-to-noise ratio (SNR) of the transmission signal of the encoded message data between the encoder 104 and the decoder 108. As illustrated in FIG. 2-1, the BER curve 202 for a given encoding/decoding system falls off quickly as the SNR increases. That is, the bit error rate at the y-axis goes down as the signal power is increased as represented by the SNR along the x-axis. For certain applications, such as data storage applications, the required bit error rate may be very low.

However, degree-1 variable nodes may cause a noise-floor or error-floor to occur. FIG. 2-2 shows a bit error rate (BER) chart 204 with a noise-floor 208. As shown in the figure, the BER curve 206 falls towards the x-axis then extends out as a noise-floor 208. Due to the shape of the noise-floor 208, to lower a bit error rate for a sensitive application, such as a storage application, the SNR may be increased to compensate for the noise-floor 208. However, in some implementations, simply increasing the SNR may not be practical or possible.

One approach for lowering the noise-floor 208 involves inverting the parity part 154 of the parity-check matrix 150 to remove degre-1 variable nodes. However, inverting a sparse matrix may result in a dense matrix, which is more computationally expensive to process (due to, e.g., increasing hardware costs, increasing processing time, increasing hardware footprint, etc.), and results in a decreased in throughput. Further, removing the degree-1 variable node removes the lower-triangular form of the parity part 154, which makes the efficient recursive encoding processes described above infeasible. Hence, there is an undesirable trade-off between low error-floors, high throughput, and hardware costs.

Figure 3:
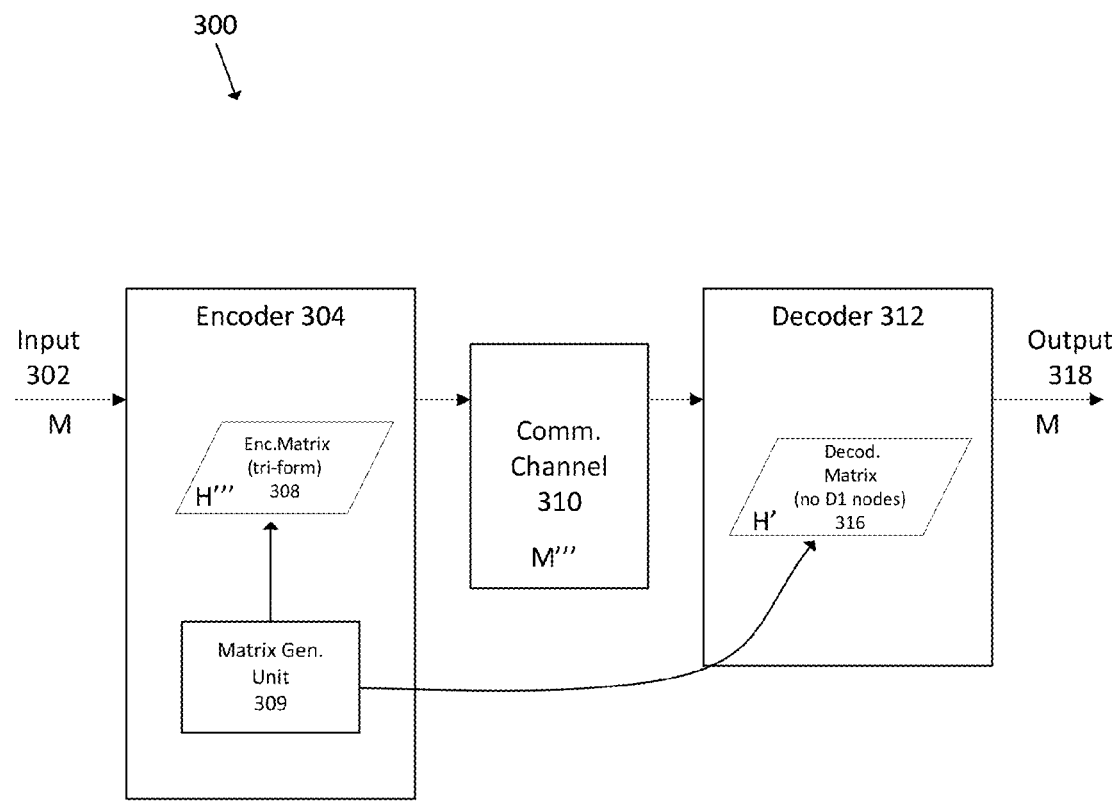
FIG. 3 illustrates an encoding and/or decoding system for implementing efficient low error-floor LDPC codes.

FIG. 3 illustrates an encoding and/or decoding system 300 for implementing low-density parity-check codes with low error-floor performance, high throughput, and low hardware costs. As shown in the figure, message data M 302 may be input into an encoder 304. In some embodiments, the encoder 304 encodes the message data M with an encoding parity-check matrix 308 (e.g., a low-density parity-check code) that is in lower-triangular form, and which may be referenced as H'''. Because the encoding parity-check matrix 308 is in lower-triangular form, the encoder 304 can recursively generate the parity bits, as described above. The result of the encoding process is the encoded message data, M'''. The encoded message data, M''', may be transmitted over communication channel(s) 310, such as wired or wireless channel(s), to a decoder 312.

The decoder 312 comprises a decoding parity-check matrix 316 that does not have degree-1 variable nodes, and which may be referenced as H'. After the decoding parity-check matrix 316 operates on the encoded message, M''', the decoder 312 provides the original message data M as the output 318.

In some embodiments, a matrix generation unit 309 may be provided for generating the encoding parity-check matrix H''' 308 from the decoding parity-check matrix H' 316 using one or more matrix operations, such as elementary matrix operations (e.g., row/column swapping, addition, multiplication, or any combination of the foregoing). As the encoding parity-check matrix 308 was generated or derived from the decoding parity-check matrix 316 using matrix operations (e.g., elementary matrix row operations), both matrices are valid parity-check matrices for operations on the message data—i.e., the encoding parity-check matrix 308 may be used for encoding message data, and the decoding parity-check matrix 316 may be used for decoding the encoded message data, even though the two matrices 308, 316 are different. That is, message data that is encoded with the encoding parity-check matrix 308 can properly (e.g., accurately) be decoded with the decoding parity-check matrix 316. In some cases, a non-transitory medium may be provided for storing the encoding parity-check matrix H''' 308, wherein the non-transitory medium may be a part of the encoder 304, or may be separate from the encoder 304 that is communicatively coupled to the encoder 304. Also, in some cases, a non-transitory medium may be provided for storing the decoding parity-check matrix H' 316, wherein the non-transitory medium may be a part of the decoder 312, or may be separate from the decoder 312 that is communicatively coupled to the decoder 312.

In some embodiments the encoder 304 comprises the matrix generation unit 309 that uses the decoding parity-check matrix H' 316 to generate the encoding parity-check matrix H''' 308. As used in this specification, the term "matrix generation unit" is not limited to a module that provides a full matrix, and may refer to any module that is configured to provide at least a part of a matrix, such as a row, a value of a cell, etc. The matrix generation unit 309 may obtain (e.g., determine or receive from another device) the decoding parity-check matrix H' 316, and may then transmit the decoding parity-check matrix H' 316 to the decoder 312 for use in decoding the encoded messages (e.g., M'''). In other embodiments, the matrix generation unit 309 may be a part of the decoder 312. In further embodiments, instead of the matrix generation unit 309 being a part of the encoder 304 or the decoder 312, the matrix generation unit 309 may be an external matrix generation unit (e.g., not integrated into the encoding/decoding architecture 300). In such cases, the matrix generation unit 309 may be communicatively coupled to the encoder 304 and/or the decoder 312. The external matrix generation unit 309 may determine the decoding parity-check matrix H' 316 and the encoding parity-check matrix H''' 308, and may then transmit the matrices 316, 308 to the encoder 304 and the decoder 312, so that the encoder 304 and the decoder 312 may store the matrices 316, 308 for use in operation.

Figure 4:
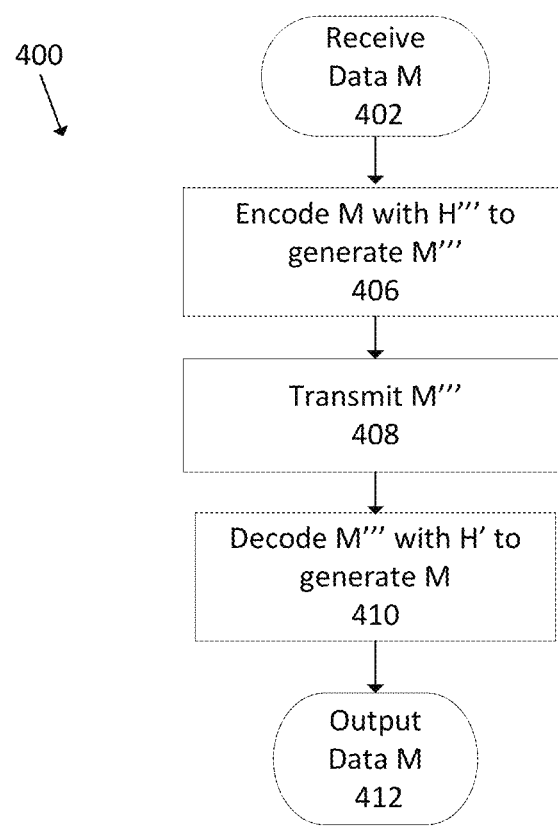
FIG. 4 shows a method of encoding and decoding message data.

FIG. 4 shows a method 400 of encoding and decoding message data using the improved encoding/decoding architecture 300 of FIG. 3. At item 402, the message data M is received by the encoder 304. At item 406, the encoder 304 uses an encoding parity-check matrix, H''' 308 to encode the message data to obtain encoded message data M'''. As described above, the encoded message data M''' includes an information part 152 and a parity part 154, the parity part 154 being recursively generated using the encoding parity-check matrix H''' 308, which is in lower-triangular form. At item 408, the encoded message data M''' is transmitted over communication channel(s) 310, such as wireless or wired communication channel(s). At item 410, the decoder 312 receives the encoded message M''', and decodes it using the decoding parity-check matrix H' 316, that does not contain degree-1 variable nodes. After decoding, the decoded message M is output from the decoder 312 (item 412).

The above encoding and decoding scheme has multiple advantages. First, no large dense matrices (e.g., inverted parity part matrices) need to be processed, thus resulting in increased throughput, smaller hardware footprint, and reduced computational expense. Further, as the decoder 312 avoids using degree-1 variable nodes, a low error bit rate may be achieved. Further, the above technique may readily be implemented into encoding/decoding architectures with little-to-no hardware customizations or modifications.

Figures 1, 5:
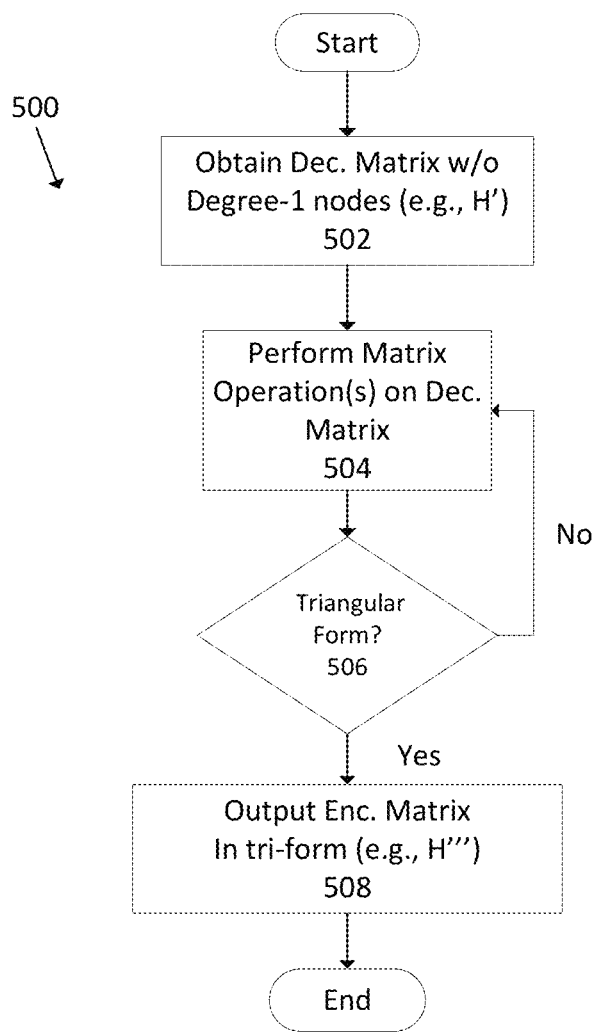

FIG. 5-1 shows a method 500 for generating an encoding parity-check matrix (e.g., the encoding parity-check matrix H''' 308) from a decoding parity-check matrix (e.g., the decoding parity-check matrix H' 316). The method 500 may be implemented in item 406 in the method 400. At item 502, the decoding parity-check matrix H' 316 that does not contain degree-1 variable nodes is obtained (e.g., generated or received). In some cases, the decoding parity-check matrix H' 316 may be obtained by performing an optimization for low error-floor performance. In some embodiments, the decoding parity-check matrix H' 316 is formed per system parameters, and then modified to remove degree-1 variable nodes.

For example, the matrix H (shown in FIG. 1-2) may be provided as the original parity-check matrix, which was determined based on system parameters, but then the matrix H may be modified to generate the decoding parity-check matrix H' 316. For example, the original matrix H may be modified to obtain a decoding parity-check matrix H' 316 that does not have degree-1 variable nodes. In some embodiments, a decoding parity-check matrix which does not have degree-1 variable nodes is directly generated without using the original parity-check matrix H. For example, H' (see FIG. 6-1) may be generated directly using system parameters (e.g., how many rows/columns, information/parity bits, sparseness parameters), and an additional parameter that the decoding parity-check matrix generated directly does not have degree-1 variable nodes. As mentioned, in some embodiments, to save computational resources, the decoding parity-check matrix H' 316 may be formed as a sparse matrix.

Returning to FIG. 5, at item 504, matrix operation(s) are performed on the decoding parity-check matrix H' 316 to generate an encoding parity-check matrix H''' 308, where the encoding parity-check matrix H''' 308 (i.e., the parity part of it) is in lower-triangular form (e.g., has degree-1 variable nodes). In some embodiments, the matrix generation unit 309 is configured to manipulate the decoding parity-check matrix H' 316 to form the encoding parity-check matrix using elementary matrix operations (e.g., elementary row operations). In some embodiments, so long as the operation(s) performed on the decoding parity-check matrix H' 316 is elementary row operation(s), the result of the operations will yield a valid parity-check matrix.

At item 506, a determination is made whether the operation(s) performed on the decoding parity-check matrix H' 316 results in a matrix that is in lower-triangular form (e.g., a parity-check matrix with a parity part in lower-triangular form). If the resultant matrix is not in lower-triangular form, the process may loop back to item 504 where one or more matrix operations may be performed to generate a resultant matrix in lower-triangular form. Alternatively, if the result of the matrix operation(s) performed at item 504 is a matrix in lower-triangular form, then the resultant matrix may be output or otherwise stored as the encoding parity-check matrix H''' 308 (item 508).

FIG. 5-2 illustrates item 504 in further detail. In some embodiments, the cells that are above a diagonal of "1s" in the parity part of the decoding parity-check matrix H' 316, and which have a value of "1", are identified. The matrix operations may then be performed in such a way to replace the cells having values of "1" that are above a diagonal row in the matrix with values of "0", using row operations. In particular, as shown in FIG. 5-2, in some embodiments, item 504 may involve identifying a first row in the parity part of the decoding parity-check matrix H' 316 with a matrix cell having a value of "1" that is above a diagonal row of the parity part of the decoding parity-check matrix H'316 (item 520). Item 520 may be performed by a matrix generation unit in some embodiments. Next, a second row in the parity of the decoding parity-check matrix H'316 with a cell having a value of "1" is identified, wherein the cell with the value of "1" in the second row is in the same column as the cell with the value of "1" in the first row (item 522). Item 522 may be performed by a matrix generation unit in some embodiments. Next, matrix row operation is performed to subtract the first row from the second row, or vice versa, to thereby obtain a new row (item 524). Item 524 may be performed by a matrix generation unit in some embodiments. Next, the first row is replaced with the new row to thereby eliminate the cell with the value of "1" in the first row (item 526). Item 526 may be performed by a matrix generation unit in some embodiments. It should be noted that the term "first row" does not necessarily refer to the row that is first in an order, and may refer to any row in the matrix. Similarly, the term "second row" does not necessarily refer to the row that is second in the order, and may refer to any row in the matrix that is different from the first row.

Various techniques may be employed to generate an encoding parity-check matrix from a decoding parity-check matrix. FIGS. 6-1 to 6-3 illustrate how an example encoding parity-check matrix can be generated from a decoding parity-check matrix. In particular, FIG. 6-1 illustrates an example of a decoding parity-check matrix H' that does not have degree-1 variable nodes. The decoding parity-check matrix H' has an information part 602 and a parity part. The decoding parity-check matrix H' does not have degree-1 variable nodes because as can be seen in the figure, the last column in the parity part 604 contains two elements with a value of "1" (see cell $\{p_{10}, h_9\}$, and cell $\{p_{10}, h_{10}\}$). In some embodiments, the initial decoding parity-check matrix H' may be generated directly from project parameters and restrictions.

While the matrix H' does not contain degree-1 variable nodes, it also is not in lower-triangular form. Thus the matrix generation unit 309 may use matrix operations to replace the cells above the triangular diagonal that have a value of "1" with cells that have a value of "0". In this example, the diagonal is denoted by "1's" from cell $\{p_1, h_1\}$ to cell $\{p_{10}, h_{10}\}$. Further, the cells to be replaced are cell $\{p_9, h_8\}$ and cell $\{p_{10}, h_9\}$. One example elementary operation that can remove the 1 in cell $\{p_{10}, h_9\}$ is adding the 9th and 10th rows of H' and storing the resultant matrix as H". That is, $h_9''=h_9'+h_{10}'$, where the "+" operations are modulo-2 (e.g., XOR).

The result of the row operation is a matrix H", which is illustrated in FIG. 6-2. An evaluation of the matrix H" may then determine that H" is still not in the lower-triangular form, as cell $\{p_9, h_8\}$ contains a value of "1". As such, one or more matrix operations may be performed on the matrix H". One example elementary operation that can remove the "1" in cell $\{p_9, h_8\}$ in the matrix H" is adding the 8th and 9th rows of H" and storing the result as a part of the matrix H'''. That is, $h_8'''=h_8''+h_9''$.

The resulting matrix H''' is illustrated in FIG. 6-3. As illustrated, the encoding matrix H''' is in lower-triangular form. Further, as the matrix H''' was generated from the decoding parity-check matrix H' using matrix operations (e.g., elementary matrix operations), both H''' and H' are valid corresponding parity-check matrices (e.g., complementary parity-check matrices). As such, the matrix H''' may be used in the encoder 304 as the encoding parity-check matrix 308 that is lower-triangular form, and the matrix H' may be used in the decoder 312 as the decoding parity-check matrix 316 that is without degree-1 variable nodes.

In some embodiments, the above approaches can be implemented in a system using quasi-cyclic LDPC codes in order to generate longer codewords and yield more efficient hardware parallelizations. Quasi-cyclic LDPC codes can be constructed from a parity-check matrix by expanding each cell that has a value of "1" in a circulant sub-matrix of m×m size, and expanding each cell with a value of "0" by an all-zero sub-matrix of m×m size. The parameter m is referred to as an expansion factor, which may be customized or optimized per implementation. In some implementations, the circulant sub-matrices with a value of "1" correspond to shifted identity matrices.

For example, FIG. 7-1 shows a portion of, $h_8$, which corresponds to the 8th row of H' (see FIG. 6-1). As illustrated, $h_8$ is expanded as several 10×10 expansion sub-matrices (where for example, m=10). In particular, the cell $\{p_7, h_8\}$, which has a value of "0" in the matrix H' in FIG. 6-1, is expanded as an all-zero sub-matrix. Similarly the cells $\{p_8, h_8\}$ and $\{p_9, h_8\}$, both of which have values of "1" in the matrix H' in FIG. 6-1, are expanded as two 10×10 shifted identity expansion sub-matrices in the example shown in FIG. 7-1. A shifted identity matrix is any matrix having a diagonal of "1"s that is shifted.

In some embodiments, where LDPC codes are implemented, some of the individual cells in the matrix H''' may feature compounding artifacts, such as multiple values of "1" in rows of the expanded sub-matrix, thus making the sub-matrix not a shifted identity matrix, e.g., a sub-matrix that has multiple shifted identity matrices. Parallelized encoding and decoding operations for such matrices (non-shifted identity matrices) may be more difficult to process compared to shifted identity matrices.

As explained, the encoding parity-check matrix H''' was generated from the decoding parity-check matrix H' using two row operations: the first row operation ($h_9''=h_9'+h_{10}'$) produced a new row for the matrix H", and the second row operation ($h_9'''=h_8''+h_9''$) produced another new row for the matrix H'''. FIG. 7-2 shows the result of the row operations expanded into sub-matrices. In particular, the cell $\{p_7, h_8\}$, which has a value of "0" in the matrix H''' in FIG. 6-3, is expanded as an all-zero sub-matrix (labeled by "$p_7$" at the top of the sub-matrix in FIG. 7-2). Further, the cell $\{p_9, h_8\}$ which had a value of "0" in the matrix H''' in FIG. 6-3, is shown in FIG. 7-2 as an all-zero sub-matrix (labeled by "$p_9$" at the top of the sub-matrix). However, the cell $\{p_8, h_8\}$ which had a value of 1 in the matrix H''', is expanded as a sub-matrix combination of three shifted identity matrices in FIG. 7-2 (labeled by "$p_8$" at the top of the sub-matrix), which is a result of the above mentioned two row operations. As such, resultant sub-matrices that have the compounding artifact (e.g., three bits per row) cannot be recursively encoded.

One approach to correct for the cell compounding artifact is to replace each compounded cell with an all-zero sub-matrix, and then perform an inversion process to generate one or more sub-matrix artifacts, which can be stored or used immediately to increase LDPC encoding/decoding efficiency. The generation of the sub-matrix artifact(s) may be performed using a sub-matrix artifact generation unit, which may be a part of the encoder, a part of the decoder, or may be separate from the encoder and the decoder. For example, let G equal the m×m sub-matrix that corresponds to the compounded cell $\{p_8, h_8\}$, as illustrated in FIG. 8-1.

Then replace the compounded cell {$p_8$, $h_8$} with an all-zero m×m sub-matrix, and let the result equal $\hat{h}_8'''$, as illustrated in FIG. 8-2. Then since $\bar{h}_8'''c^T=0$ (a constraint of the original parity-check matrix), the matrix product of the parity value $p_8$ with G equals the product of $\hat{h}_8'$ with $c^T$. That is, $Gp_8=\hat{h}_8'''c^T$. Provided that G is full-rank, G can be inverted to generate $G^{-1}$, as illustrated in FIG. 8-3. Thus using $G^{-1}$, $p_8$ can then be determined using: $p_8=G^{-1}\hat{h}'''c^T$.

The above technique is advantageous because $\hat{h}_8'''c^T$ can be computed from the previously computed parity bits, thus allowing recursive encoding/decoding operations to be implemented. Further, after the compounded cell's parity bit $p_8$ is determined, the rest of the parity bits (e.g., $p_9$, $p_{10}$) can be computed using the above approaches that do not require $G^{-1}$. It should be noted that the above technique may be employed for the encoding parity-check matrix for the encoder, for the decoding parity-check matrix for the decoder, or for both.

In some cases, the encoder may be configured to use the sub-matrix artifact to determine one or more parity bits that correspond to the parity part of the encoding parity-check matrix. Similar, the decoder may be configured to use the sub-matrix artifact to determine one or more parity bits that correspond to the parity part of the decoding parity-check matrix.

It should be noted that $G^{-1}$ is likely not a sparse matrix, as the inverse of a sparse matrix is typically a dense matrix. Thus processing $G^{-1}$ may increase the utilization of hardware resources, footprint, or computational expense. Nonetheless, $G^{-1}$ is a dense sub-matrix m×m in size, and m can be much smaller than codeword length. Using $G^{-1}$ avoids high error-floors (such as the noise-floor 208 shown FIG. 2-2) because the matrix H' is utilized at the decoder 312 in which degree-1 variables are absent. It also avoids inverting the whole parity part 154 of the matrix that corresponds to the length of parity bits. It should be noted that H' is still a valid parity check matrix for decoding because H''' was obtained from H' through elementary row operation(s).

Figure 9:
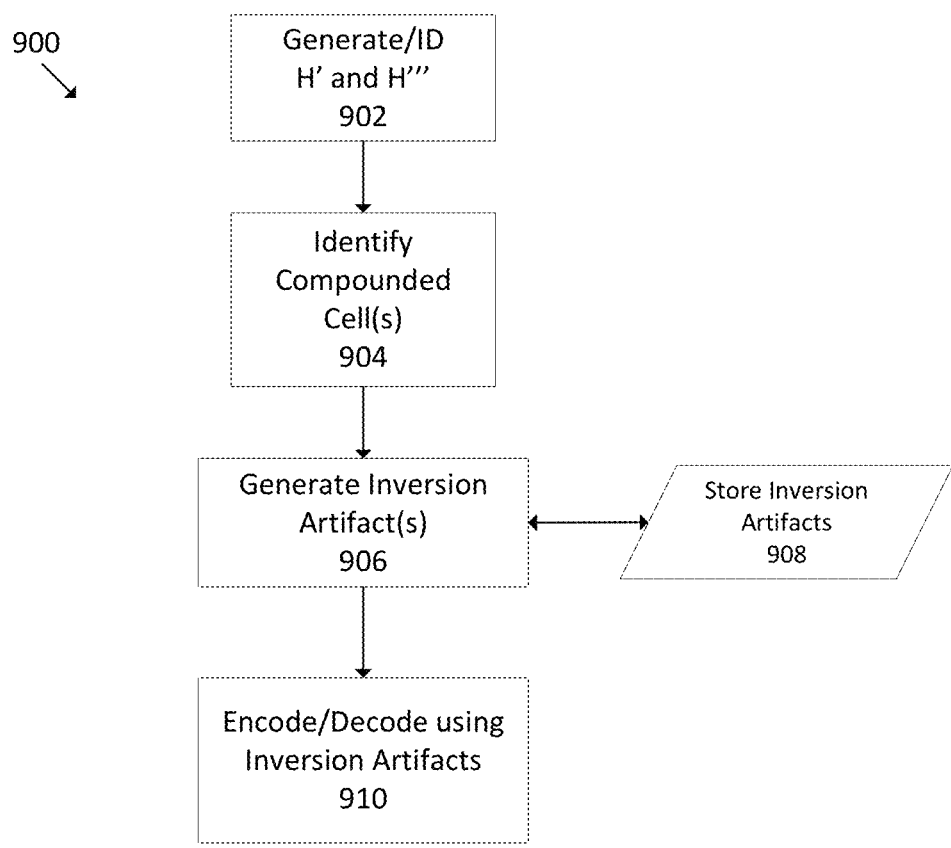
FIG. 9 shows a method for generating sub-matrix artifacts.

FIG. 9 shows a method 900 for determining a sub-matrix artifact (e.g., sub-matrix inverter $G^{-1}$). At item 902, the encoding parity-check matrix H''' and decoding parity-check matrix H' are generated or identified, as explained above. At item 904, compounded cells that correspond to invalid sub-matrices (e.g., sub-matrices with multiple values of "1" per row) are identified. For example, the data corresponding to an invalid sub-matrix may be set to "G". At item 906, one or more sub-matrix artifacts (inversion artifacts) are generated. Next, the sub-matrix artifacts may be stored for later encoding and decoding. For example, once the matrix H' and the matrix H''' are known, the sub-matrix artifacts $G^{-1}$ and/or $\hat{h}_8'''$ may be determined and stored in the decoder 312 or the encoder 304 for immediate processing or for later encoding/decoding of message data (item 908). In some cases, the determined $G^{-1}$, $\hat{h}_8'''$, combination of the foregoing, or product of $G^{-1}$ and $\hat{h}_8'''$ may be stored in a non-transitory medium. The stored information may then be used to encode message data and/or decode encoded message data (item 910).

Figure 10:
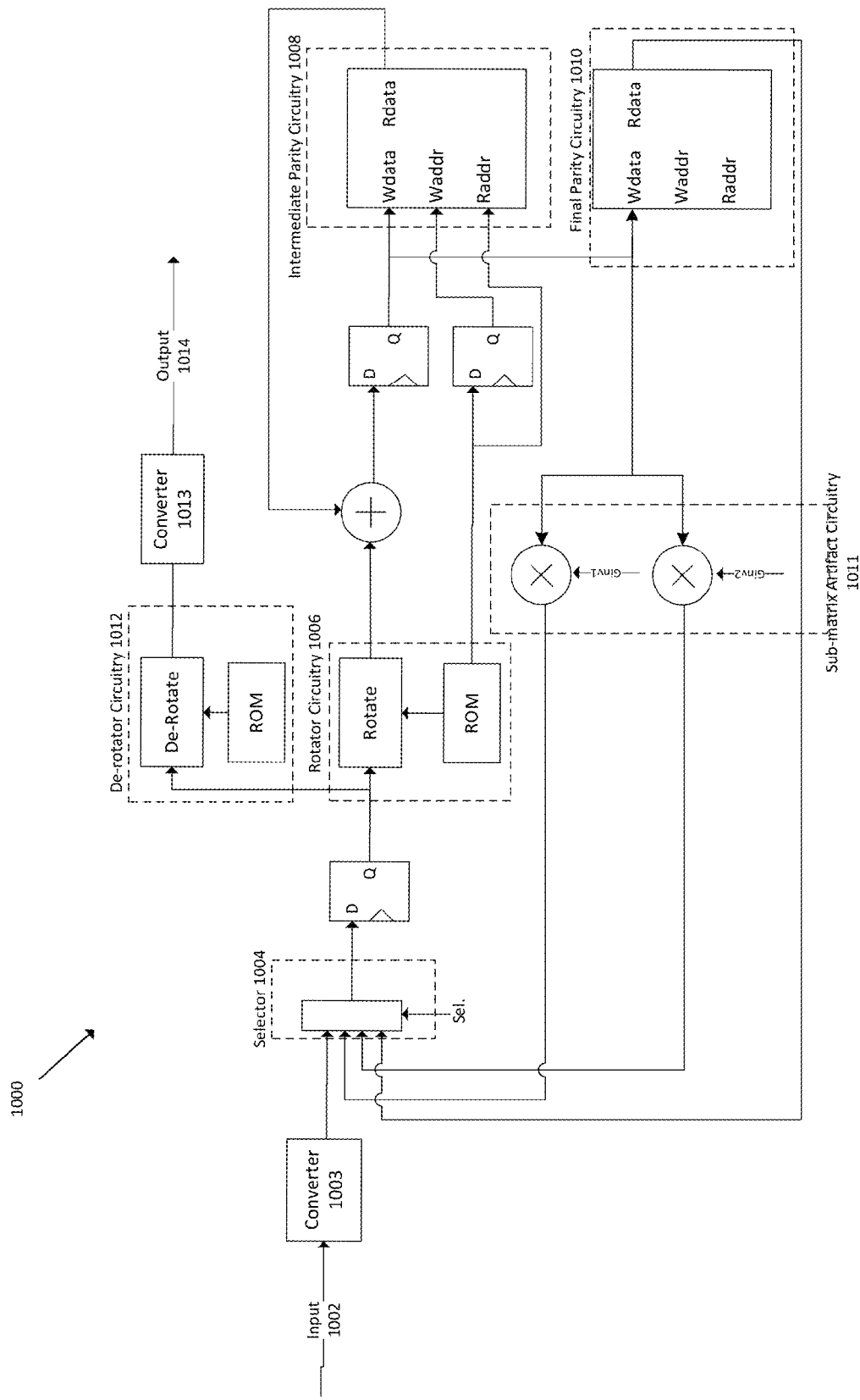
FIG. 10 illustrates an encoder circuit configured to provide sub-matrix artifacts.

FIG. 10 illustrates an example of an encoder circuitry 1000 that is configured to provide sub-matrix artifacts to increase encoding efficiency. The encoder circuitry 1000 may be a part of the encoder 304. As shown in the figure, incoming message data 1002 may be input into the encoder circuitry 1000. The encoder circuitry 1000 includes a converter 1003 for converting the message data 1002 to a different bit size for parallelization. For example, if the incoming message data 1002 comprises 16 input bits, the converter 1003 may convert the input bits into P-bits, where P is the parallelization number, such as 64 bits or 80 bits. The converted output from the converter 1003 is then output to a selector circuitry 1004, which comprises a multiplexor configured to select either the information part or the calculated parity part of a parity-check matrix. The output of the selector circuitry 1004 may be passed to rotator circuitry 1006, where rotation values may be stored and read from read-only memory (ROM).

The output of the rotator circuitry 1006 may be passed to an intermediate parity circuitry 1008. In the illustrated figure, the "+" component is an XOR function for adding rotated data from the rotator circuitry 1006 to the data stored in the intermediate parity circuit 1008. Thus, the addition is achieved using an XOR gate. The two boxes between the rotator circuitry 1006 and the parity circuitry 1008 are pipeline registers used to delay the write address with respect to the read address. In one implementation, data is read from a certain address in the parity circuitry 1008, and it is then added to data from the rotator circuitry 1006. The result is then stored back to the same address in the parity circuitry 1008. In some embodiments, the intermediate parity values are stored in a first parity random-access memory (RAM) that is 16 bits deep (e.g., 16 bits of memory long) or other values of depth. In some embodiments, the first parity RAM is initialized or set to zero, then rotated or shifted data is added (e.g., added using XOR) to the intermediate parity values. The resultant values may be stored back into the first parity RAM (e.g., RAM in the intermediate parity circuitry 1008, not depicted). The completed parity values may then be passed to a final parity circuitry 1010, and stored in a second parity RAM (e.g., RAM in the final parity circuitry 1010, not depicted). In some embodiments, the second parity RAM may also be 16 bits deep or other values of depth. In some embodiments, when the final parity values are stored in the second parity RAM, the intermediate parity circuitry is again initialized or set to zero.

As shown in the figure, the completed parity values are also passed to a sub-matrix artifact circuitry 1011. In some embodiments, the sub-matrix artifact circuitry 1011 may comprise one or more inversion matrices (e.g., sub-matrix interverter, $G^{-1}$), which are illustrated in FIG. 10 as "Ginv1" and "Ginv2". During the parity calculations, one or more intermediate parity rows may be captured and multiplied by the matrices Ginv1 and Ginv2 to generate parity values for compounded cells. Which rows are captured, how many rows are captured, and the values of Ginv1 and Ginv may depend on the matrix H', the matrix H'', and the parallelization parameters of the encoding circuitry. For instance, when the parallelization number is 64, intermediate parity values of a row 11 and a row 12 may be captured and multiplied by Ginv1 and Ginv2. The result values of the multiplication may be passed to the selector circuitry 1004 that selects between the information part and the parity part. In some embodiments, as explained above in regards to FIG. 9, the sub-matrix artifact values, e.g., Ginv1 and Ginv2, may be preconfigured in advance based on the parity matrix, e.g., H'''.

The final parity values stored in the final parity RAM may then be read and passed to the multiplexing circuitry of the selector circuitry 1004 that selects between the information part and the parity part. The output of the selector circuitry 1004 may be passed to a de-rotation circuitry 1012 where the rotation values are zeroes during the information part, and are read from a ROM during the parity part. The output from the de-rotation circuitry 1012 may then be passed to a converter 1013 that converts the parallel bit size (e.g., 64 bits, 80 bits) to the original bit size (e.g., 16 bits.). The converter 1013 then provides the output 1014.

In the above embodiments, the encoding parity-check matrix has been described as being derived from a decoding parity-check matrix. In other embodiments, the encoding parity-check matrix may be determined without using any decoding parity-check matrix. Also, in other embodiments, the encoding parity-check matrix may be initially determined, and then the matrix generation unit determines the decoding parity-check matrix based on the encoding parity-check matrix. The encoding parity-check matrix is in lower-triangular form, and the decoding parity-check matrix that does not comprise any degree-1 node in a parity part of the decoding parity-check matrix.

Because one or more of the examples described herein may be implemented in an FPGA, a detailed description of such an integrated circuit (IC) is provided. However, it should be understood that other types of ICs may benefit from the features described herein.

Programmable logic devices ("PLDs") are a type of integrated circuit that may be programmed to perform specified logic functions. One type of PLD, the field programmable gate array ("FPGA"), includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

Figure 11:
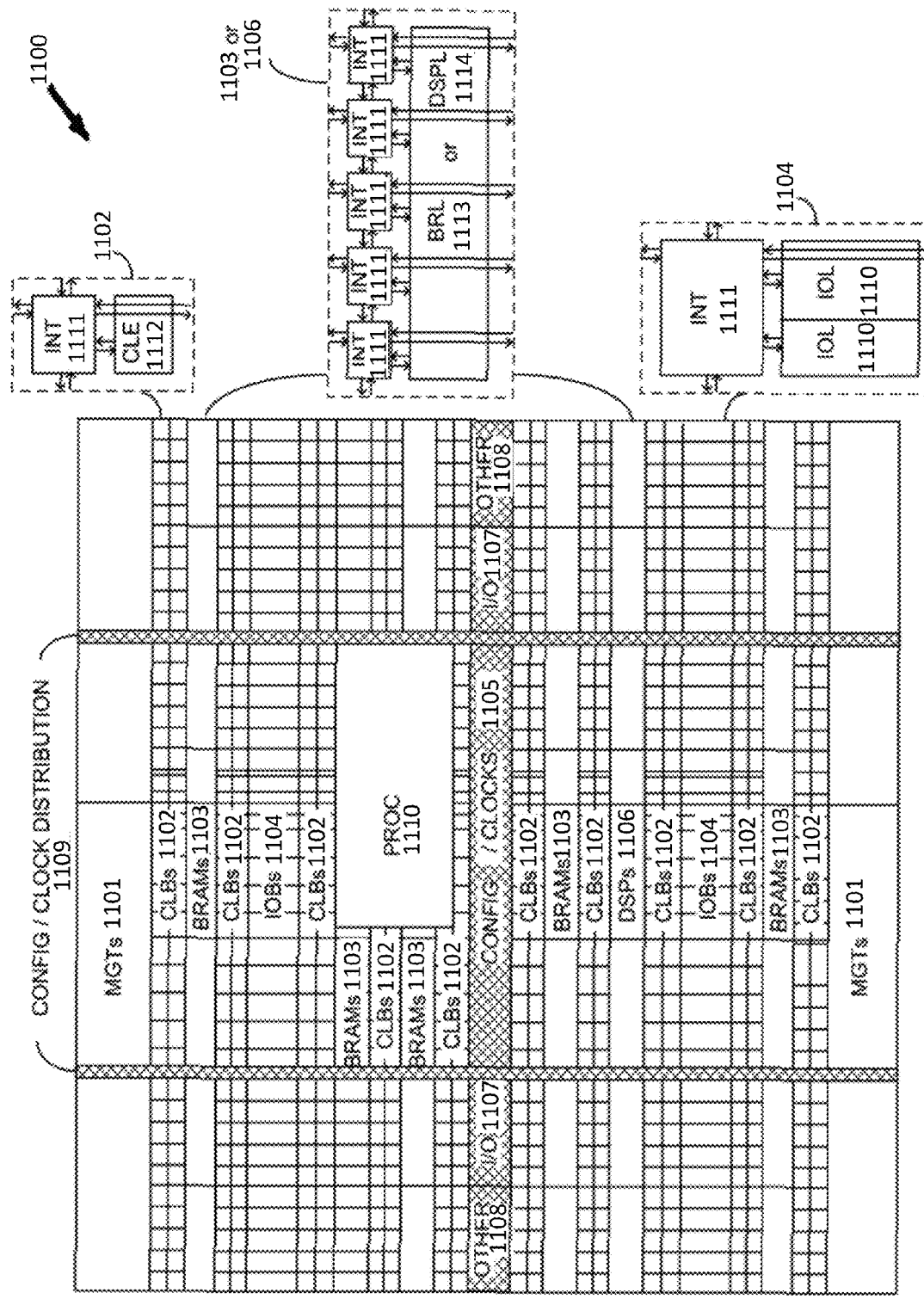
FIG. 11 illustrates an FPGA architecture with which one or more embodiments described herein may be implemented.

As noted above, advanced FPGAs can include several different types of programmable logic blocks in the array. For example, FIG. 11 illustrates an example of a FPGA architecture 1100. The FPGA architecture 1100 may be used to implement one or more features (e.g., the encoder 304, the decoder 312, the matrix generation unit 309, the encoder circuitry 1000, one or more components of any of the foregoing, etc.) described herein. The FPGA architecture 1100 includes a large number of different programmable tiles including multi-gigabit transceivers ("MGTs") 1101, configurable logic blocks ("CLBs") 1102, random access memory blocks ("BRAMs") 1103, input/output blocks ("IOBs") 1104, configuration and clocking logic ("CONFIG/CLOCKS") 1105, digital signal processing blocks ("DSPs") 1106, specialized input/output blocks ("I/O") 1107 (e.g., configuration ports and clock ports), and other programmable logic 1108 such as digital clock managers, analog-to-digital converters, system monitoring logic, and so forth. Some FPGAs also include dedicated processor blocks ("PROC") 1110.

In some FPGAs, each programmable tile includes a programmable interconnect element ("INT") 1111 having standardized connections to and from a corresponding interconnect element in each adjacent tile. Therefore, the programmable interconnect elements taken together implement the programmable interconnect structure for the illustrated FPGA. The programmable interconnect element 1111 also includes the connections to and from the programmable logic element within the same tile, as shown by the examples included at the top of FIG. 11.

For example, a CLB 1102 can include a configurable logic element ("CLE") 1112 that can be programmed to implement user logic plus a single programmable interconnect element ("INT") 1111. A BRAM 1103 can include a BRAM logic element ("BRL") 1113 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 1106 can include a DSP logic element ("DSPL") 1114 in addition to an appropriate number of programmable interconnect elements. An 1OB 1104 can include, for example, two instances of an input/output logic element ("IOL") 1115 in addition to one instance of the programmable interconnect element 1111. As will be clear to those of skill in the art, the actual I/O pads connected, for example, to the I/O logic element 1115 typically are not confined to the area of the input/output logic element 1115.

In the pictured embodiment, a horizontal area near the center of the die (shown in FIG. 11) is used for configuration, clock, and other control logic. Vertical columns 1109 extending from this horizontal area or column are used to distribute the clocks and configuration signals across the breadth of the FPGA.

Some FPGAs utilizing the architecture illustrated in FIG. 11 include additional logic blocks that disrupt the regular columnar structure making up a large part of the FPGA. The additional logic blocks can be programmable blocks and/or dedicated logic. For example, processor block 1110 spans several columns of CLBs and BRAMs.

Note that FIG. 11 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 11 are purely exemplary. For example, in an actual FPGA more than one adjacent row of CLBs may be included wherever the CLBs appear, to facilitate the efficient implementation of user logic, but the number of adjacent CLB rows varies with the overall size of the FPGA.

Figure 12:
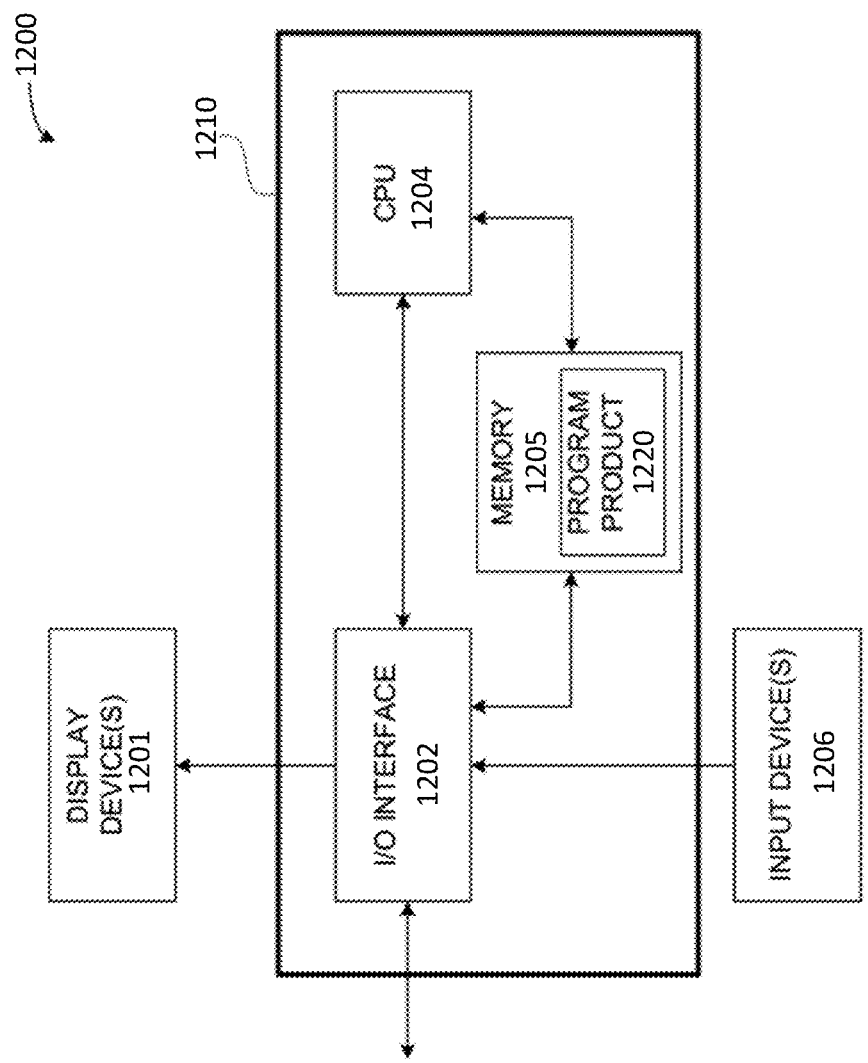
FIG. 12 is a block diagram depicting an exemplary computer system that may be used to implement one or more embodiments described herein.

In other cases, one or more of the features described herein may be implemented using a specialized processing system 1200. FIG. 12 is a block diagram depicting an example of a specialized processing system 1200. The processing system 1200 may include a programmed processor 1210 coupled to one or more display devices 1201, such as Cathode Ray Tube ("CRT") displays, plasma displays, Liquid Crystal Displays ("LCD"), projectors, etc., and to one or more input devices 1206, such as a keyboard, a cursor pointing device, a touch screen, etc. The processing system 1200 by itself or networked with one or more other systems 1200 may provide an information handling system.

The processor 1210 may be programmed with a known operating system, which may be Mac OS, Java Virtual Machine, Real-Time OS Linux, Solaris, iOS, Android Linux-based OS, Unix, or a Windows operating system, among other known platforms. The processor 1210 includes a central processing unit (CPU) 1204, memory 1205, and an input/output ("I/O") interface 1202. CPU 1204 may be any type of microprocessor. Support circuits (not shown) may include cache, power supplies, clock circuits, data registers, and the like. Memory 1205 may be directly coupled to CPU 1204 or coupled through I/O interface 1202. At least a portion of an operating system may be disposed in memory 1205. Memory 1205 may include one or more of the following: flash memory, random access memory, read only memory, magneto-resistive read/write memory, optical read/write memory, cache memory, magnetic read/write memory, and the like, as well as non-transitory signal-bearing media as described below. In some cases, the memory 1205 may include a program product 1220 having a set of instructions. The instructions, when processed by the processor 1210, causes one or more processes or features described herein to be performed.

I/O interface 1202 may include chip set chips, graphics processors, and/or daughter cards, among other known circuits. An example of a daughter card may include a network interface card ("NIC"), a display interface card, a modem card, and a Universal Serial Bus ("USB") interface card, among other known circuits. Thus, I/O interface 1202 may be coupled to a keyboard, network, mouse, display printer, and interface circuitry adapted to receive and transmit data, such as data files and the like. The processor 1210 may be communicatively coupled to a number of client computers, server computers, or any combination thereof via a conventional network infrastructure, such as a company's Intranet and/or the Internet, for example, allowing distributed use for interface generation.

In some cases, the processor 1210 may include a matrix generation unit (e.g., a decoding parity-check matrix generation unit), an matrix operation unit for performing matrix operations, a compounded cell(s) identification for identifying compounded cells, and an inversion artifact(s) generation unit for generating inversion artifact(s).

Although particular features have been shown and described, it will be understood that they are not intended to limit the claimed invention, and it will be made obvious to those skilled in the art that various changes and modifications may be made without departing from the spirit and scope of the claimed invention. The specification and drawings are, accordingly to be regarded in an illustrative rather than restrictive sense. The claimed invention is intended to cover all alternatives, modifications and equivalents.

What is claimed is:

1. A method for providing data encoding, comprising:
   providing an encoding parity-check matrix derived from a decoding parity-check matrix, wherein a first parity part of the encoding parity-check matrix is in lower-triangular form, and wherein each column of a second parity part of the decoding parity-check matrix has a degree greater than one;
   receiving message data; and
   encoding the message data with the encoding parity-check matrix to generate an encoded message data.

2. The method of claim 1, in which the encoding parity-check matrix is derived from the decoding parity-check matrix using one or more matrix operations.

3. The method of claim 1, wherein the encoding parity-check matrix is derived from the decoding parity-check matrix by performing one or more matrix row operations to change a first matrix cell with a value of "1" to a value of "0", the first matrix cell being above a diagonal of matrix cells in the second parity part of the decoding parity-check matrix.

4. The method of claim 1, further comprising determining the encoding parity-check matrix by:
   identifying a first row in the decoding parity-check matrix having a first matrix cell with a value of "1" that is above a diagonal row in the second parity part of the decoding parity-check matrix;
   identifying a second row in the decoding parity-check matrix having a second matrix cell with a value of '1", wherein the second matrix cell with the value of "1" in the second row is in a same column as the first matrix cell with the value of "1" in the first row;
   performing one or more matrix row operations to subtract the second row from the first row, or vice versa, to obtain a new row; and
   replacing the first row with the new row.

5. The method of claim 1, in which the encoding parity-check matrix comprises a quasi-cyclic low-density parity-check (LDPC) matrix, the quasi-cyclic LDPC matrix having an expansion sub-matrix.

6. The method of claim 5, further comprising generating a sub-matrix artifact by inverting the expansion sub-matrix.

7. The method of claim 6, further comprising using the sub-matrix artifact to determine one or more parity bits that correspond to the first parity part of the encoding parity-check matrix.

8. The method of claim 1, comprising:
   transmitting the encoded message data to a decoder for decoding the encoded message data using the decoding parity-check matrix.

9. A system, comprising:
   a first non-transitory medium for storing an encoding parity-check matrix derived from a decoding parity-check matrix, wherein a first parity part of the encoding parity-check matrix is in lower triangular form, and wherein each column of a second parity part of the decoding parity-check matrix has a degree greater than one; and an encoder configured to encode message data with the encoding parity-check matrix to generate an encoded message data, wherein the first non-transitory medium is a part of the encoder or is communicatively coupled to the encoder.

10. The system of claim 9, wherein the decoding parity-check matrix is for decoding the encoded message data.

11. The system of claim 9, wherein the first parity part of the encoding parity-check matrix is different from the second parity part of the decoding parity-check matrix.

12. The system of claim 9, further comprising a matrix generation unit configured to derive the encoding parity-check matrix from the decoding parity-check matrix using one or more matrix operations, the matrix generation unit being a part of the encoder or being in communication with the encoder.

13. The system of claim 12, wherein the one or more matrix operations include one or more matrix row operations.

14. The system of claim 13, wherein the matrix generation unit is configured to perform the one or more matrix row operations to change a first matrix cell with a value of "1" to a value of "0", the first matrix cell being above a diagonal of matrix cells in the second parity part of the decoding parity-check matrix.

15. The system of claim 12, wherein the matrix generation unit is configured to determine the encoding parity-check matrix by:

identifying a first row in the decoding parity-check matrix having a first matrix cell with a value of "1" that is above a diagonal row in the second parity part of the decoding parity-check matrix;

identifying a second row in the decoding parity-check matrix having a second matrix cell with a value of "1", wherein the second matrix cell with the value of "1" in the second row is in a same column as the first matrix cell with the value of "1" in the first row;

performing one or more matrix row operations to subtract the second row from the first row, or vice versa, to obtain a new row; and replacing the first row with the new row.

16. The system of claim 9, in which the encoding parity-check matrix comprises a quasi-cyclic low-density parity-check (LDPC) matrix, the quasi-cyclic LDPC matrix having an expansion sub-matrix.

17. The system of claim 16, further comprising a sub-matrix artifact generation unit configured to generate a sub-matrix artifact by inverting the expansion sub-matrix.

18. The system of claim 17, in which the encoder is configured to use the sub-matrix artifact to determine one or more parity bits that correspond to the first parity part of the encoding parity-check matrix.

19. The system of claim 9, further comprising:

a decoder configured to receive the encoded message data and decode the encoded message based on the decoding parity-check matrix; and a second non-transitory medium for storing the decoding parity-check matrix, wherein the second non-transitory medium is a part of the decoder or is communicatively coupled to the decoder.

20. A system, comprising:

a decoder configured to receive an encoded message data, and to decode the encoded message data based on a decoding parity-check matrix including a first parity part, wherein each column of the first parity part has a degree greater than one, wherein the encoded message data is based on an encoding parity-check matrix having a second parity part that is in lower-triangular form, and a non-transitory medium for storing the decoding parity-check matrix, wherein the non-transitory medium is a part of the decoder or is communicatively coupled to the decoder.

* * * * *